(12) United States Patent
Sarpatwari et al.

(10) Patent No.: US 11,545,194 B2
(45) Date of Patent: Jan. 3, 2023

(54) DYNAMIC READ VOLTAGE TECHNIQUES

(71) Applicant: Micron Technology, Inc., Boise, ID (US)

(72) Inventors: Karthik Sarpatwari, Boise, ID (US); Nevil N. Gajera, Meridian, ID (US); Jessica Chen, Boise, ID (US); Lingming Yang, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 65 days.

(21) Appl. No.: 17/306,562

(22) Filed: May 3, 2021

(65) Prior Publication Data

US 2022/0351759 A1 Nov. 3, 2022

(51) Int. Cl.
 *G11C 7/10* (2006.01)
(52) U.S. Cl.
 CPC .................. *G11C 7/1051* (2013.01)
(58) Field of Classification Search
 CPC .................................... G11C 7/1051
 USPC .................................... 365/189.15
 See application file for complete search history.

(56) References Cited

U.S. PATENT DOCUMENTS

| 10,026,486 | B1* | 7/2018 | Dutta | G11C 16/3459 |
| 10,235,294 | B1* | 3/2019 | Lu | G11C 16/3427 |
| 2021/0375371 | A1* | 12/2021 | Lien | G11C 16/0483 |

OTHER PUBLICATIONS

Shi et al. "A resistor/transconductor network for linear fitting," in IEEE Transactions on Circuits and Systems II: Analog and Digital Signal Processing, vol. 47, No. 4, pp. 322-331, Apr. 2000, doi: 10.1109/82.839668.

* cited by examiner

*Primary Examiner* — Anthan Tran
(74) *Attorney, Agent, or Firm* — Holland & Hart LLP

(57) ABSTRACT

Methods, systems, and devices for dynamic read voltage techniques are described. In some examples, a memory device may include one or more partitions made up of multiple disjoint subsets of memory arrays. The memory device may receive a read command to read the one or more partitions and enter a drift determination phase. During the drift determination phase, the memory device may concurrently apply a respective voltage of a set of voltages to each disjoint subset and determine a quantity of memory cells in each disjoint subset that have a threshold voltage below the applied voltage. Based on a comparison between the determined quantity of memory cells and a predetermined quantity of memory cells, the memory device may select a voltage from the set of voltages and utilize the selected voltage to read the one or more partitions.

25 Claims, 7 Drawing Sheets

DYNAMIC READ VOLTAGE TECHNIQUES

FIELD OF TECHNOLOGY

The following relates generally to one or more systems for memory and more specifically to dynamic read voltage techniques.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
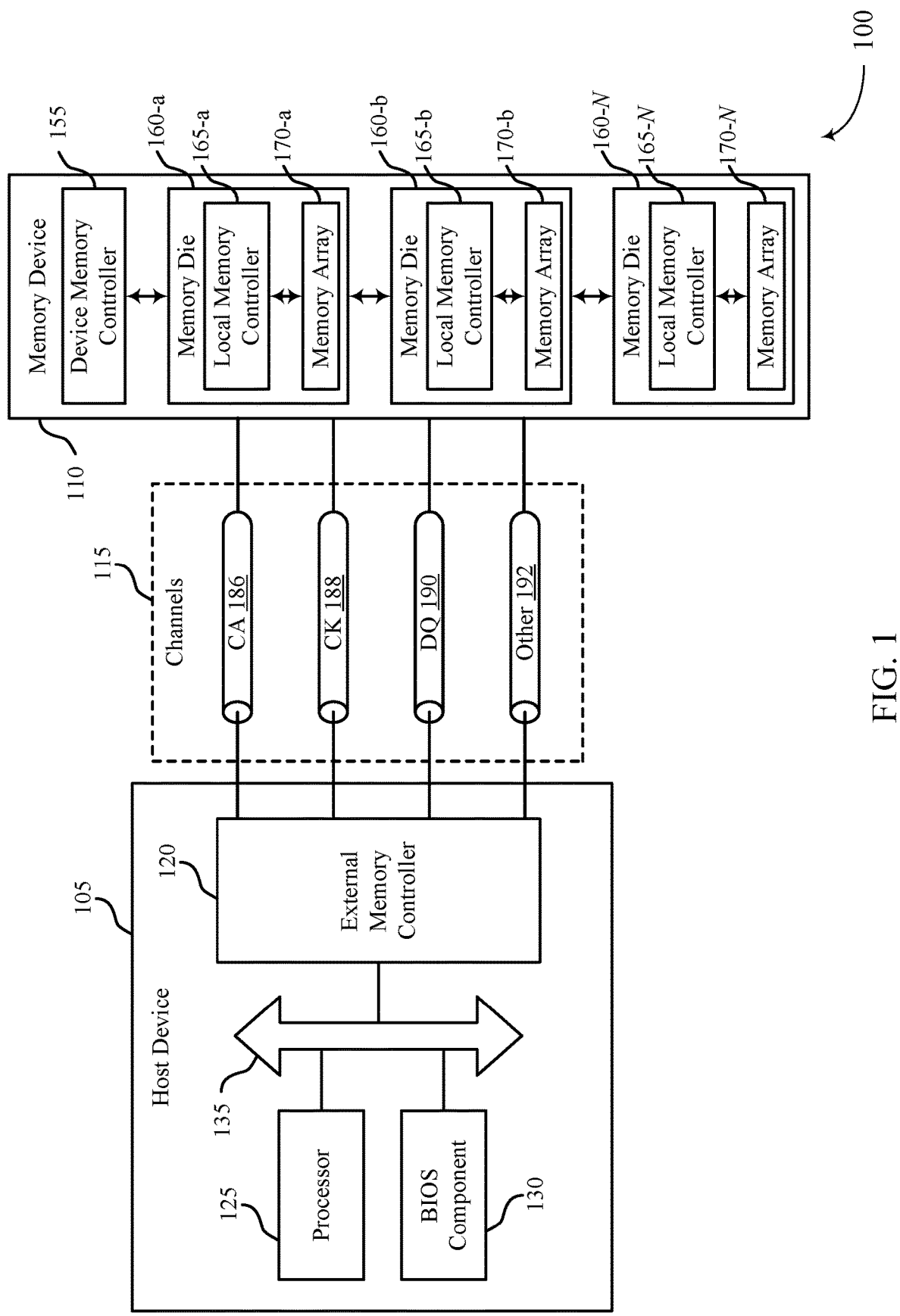
FIG. 1 illustrates an example of a system that supports dynamic read voltage techniques in accordance with examples as disclosed herein.

A memory device may include multiple memory arrays of memory cells (e.g., a partition including multiple memory tiles) and may perform a read operation on the memory arrays. That is, the memory device may apply a voltage (e.g., a read voltage) to the memory arrays via one or more access lines (e.g., a word line or a bit/digit line) to sense a logic state stored. The memory device may sense the logic states stored in each memory cell based on characteristics of the memory cell in the presence of the applied voltage. For example, the memory device may determine a logic state stored in a memory cell based on whether the applied voltage exceeds a threshold voltage of the memory cell causing current to run through the memory cell. In some cases, this phenomenon may be described as a snap-back event or thresholding the memory cell. If the applied voltage induces a current through the memory cell, the memory device may determine that the memory cell is storing a first logic state (e.g., a SET state). Additionally, if the applied voltage does not induce a current through the memory cell, the memory device may determine that the memory cell is storing a second logic state (e.g., a RESET state).

In some examples, the threshold voltage of one or more memory cells in the memory arrays may drift (e.g., increase or decrease) over time. For example, electrical characteristics of a memory cell (e.g., resistivity of the memory cell) may change after repeated access operations are performed on the memory cell resulting in a drift in threshold voltage. In some cases, a memory device may be configured to adjust a voltage applied to the arrays of memory cells during an access operation (e.g., a read operation or a write operation) to account for drift. To determine whether drift has occurred or to determine a voltage to apply during a read operation in the event that drift has occurred (or both), the memory device may employ techniques such as count-based assessment. For example, during a read operation the memory device may apply an incrementally increasing voltage (e.g., a pre-read voltage) to memory arrays. The memory device may increase the voltage until the voltage reaches a voltage value that causes some group (e.g., a preconfigured percentage, a quantity of) the memory cells of the memory arrays to threshold (e.g., undergo a snap-back event). The memory device may then utilize the voltage value when subsequently accessing (e.g., reading) the memory arrays. For example, the memory device may apply an encoding scheme such that 50% of the memory cells of the multiple memory arrays have a given first logic state (e.g., SET state). As such, during a count-based assessment procedure the memory device may increase the voltage until 50% of the memory cells of the memory arrays threshold or undergo a snap-back event. During count-based assessment, multiple sense operations may be performed (e.g., one for each increase in voltage). But performing multiple sense operations during an access operation (e.g., read operation) using other techniques different than those disclosed in the present disclosure may increase a latency associated with the access operation.

According to aspects of the current disclosure, a memory device may perform concurrent drift determination operations on disjoint subsets of the memory arrays (e.g., disjoint subsets of tiles of a partition). For example, the memory device may apply different voltages (e.g., pre-read voltages) to respective disjoint subset of memory arrays concurrently (e.g., during time intervals that at least partially overlap in time). Here, the memory device may determine a quantity of memory cells within each disjoint subset that threshold in response to applying the pre-read voltage. The memory device may then select a voltage to apply during the read operation based on the determined quantity of memory cells within each disjoint subset that threshold in response to applying one or more of the pre-read voltages.

In some examples, the memory device may select a first voltage from the one or more pre-read voltages applied in response to the determined quantity of memory cells within each disjoint subset that threshold in response the applying the different one or more pre-read voltages. For example, if 40% of the memory cells within a first disjoint subset threshold in response to the memory device applying a first pre-read voltage to the first disjoint subset and 50% of the memory cells within a second disjoint subset threshold in response to the memory device applying a second (e.g., different) pre-read voltage to the second disjoint subset, the memory device may be configured to select the second pre-read voltage to apply to the memory arrays during the read operation. In another example, application of the pre-read voltages to each disjoint subset may not cause the predetermined quantity (e.g., 50%) of memory cells to threshold. In such example, the memory device may not select one of the pre-read voltages as the read voltage for a subsequent read operation, but may instead use the pre-read voltages and the quantity of thresholding memory cells to predict a read voltage that may result in the predetermined quantity of memory cells within the disjoint subsets to threshold. For example, the memory device may apply a first pre-read to a first disjoint subset causing 2.275% of the memory cells within the first disjoint subset to threshold and apply a second pre-read voltage to a second disjoint subset causing 15.867% of the memory cells within the second disjoint subset to threshold. Additionally or alternatively, the memory device may apply one or more pre-read voltages that cause less than the predetermined quantity (e.g., 50%) of memory cells to threshold and one or more pre-read voltages that cause more than the predetermined quantity of memory cells to threshold. Based on this, the memory device may project or extrapolate a voltage at which 50% (e.g., predetermined quantity) may threshold.

By performing drift determination operations on the memory arrays, the memory device may have a higher reliability when compared to a memory device using other different techniques that does not utilize techniques to account for a voltage drift of memory cells over time. Additionally, because the memory device disclosed in the present disclosure may apply multiple pre-read voltages to respective sub-groups concurrently (e.g., as opposed to sequentially using other different techniques), the memory device may reduce latency associated with read operations, among other advantages.

Features of the disclosure are initially described in the context of memory systems, dies, and arrays as described with reference to FIGS. 1-3. Features of the disclosure are described in the context of a system, a timing diagram, and a process flow as described with reference to FIGS. 3-5. These and other features of the disclosure are further illustrated by and described with reference to an apparatus diagram and flowcharts that relate to dynamic read voltage techniques as described with references to FIGS. 6 and 7.

FIG. 1 illustrates an example of a system 100 that supports dynamic read voltage techniques in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include various peripheral components. The peripheral components may be any input device or output device, or an interface for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral component(s) may be other components understood by a person having ordinary skill in the art as a peripheral.

In some examples, the system 100 or the host device 105 may include an input component, an output component, or both. An input component may represent a device or signal external to the system 100 that provides information, signals, or data to the system 100 or its components. In some examples, and input component may include a user interface or interface with or between other devices. In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a row line or column line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, the CA channel 186 may include a read command with an address of the desired data. In some examples, a CA channel 186 may include any quantity of signal paths to decode one or more of address or command data (e.g., eight or nine signal paths).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some examples, memory cells of a memory device 110 may experience drift (e.g., a shift in a threshold voltage associated with one or more memory cells of the memory cells of the memory device 110). In some instances, drift may occur due to accessing the memory cells multiple times, among other conditions. That is, after repeated access operations, properties of the memory cell such as the resistivity may change, thus shifting the threshold voltage of the memory cell. To account for drift, the memory device 110 may adjust a read voltage applied to the memory cells of the memory device 110 during a read operation.

In some cases, the memory device 110 may adjust the read voltage based on performing count-based assessment. For example, upon receiving a read command from the host device 105, the memory device 110 may apply incrementally increasing pre-read voltages to a set of memory arrays 170 (e.g., partitions) of the memory device 110. After each increase in voltage, the memory device 110 may determine a quantity of memory cells of the set of memory arrays 170 that have a threshold voltage that is lower than the applied voltage.

In cases that the quantity of memory cells exceeds or equals a predetermined threshold quantity of memory cells, the memory device 110 may use the last applied voltage as the read voltage for performing a read operation on the set of memory arrays 170. Here, performing sequential drift determination operations (e.g., by sequentially applying different pre-read voltages) may introduce latency in regards to the read operation.

In some other cases, the memory device 110 may perform multiple drift determination operations concurrently. For example, a set of memory arrays 170 (e.g., corresponding to a partition of the memory device 110) may be divided into disjoint subsets of memory arrays 170. When the memory device 110 receives a read command from the host device 105, the memory device 110 may apply one or more different pre-read voltages to each respective disjoint subset of the memory arrays 170. In some examples, each of the pre-read voltages may have a different magnitude. After applying the different pre-read voltages to each respective disjoint subset of memory arrays 170, the memory device 110 may determine a quantity of memory cells within each respective disjoint subset that has a threshold voltage lower than the pre-read voltage applied to that disjoint subset. The memory device 110 may then compare the determined quantities of memory cells to a predetermined quantity of memory cells. In some examples, the memory device 110 may select a voltage to apply to the set of memory arrays 170 for the read operation based on applying the different pre-read voltages to the set of memory arrays 170. For example, the memory device may select a voltage to apply to the set of memory arrays 170 for the read operation based on the pre-read voltage that is associated with the quantity of memory cells closest or most similar in value to the predetermined quantity of memory cells and use the selected voltage as the read voltage for subsequent reading of the memory cells. In another example, the memory device may not select one of the pre-read voltages as the read voltage for a subsequent read operation, but may instead use the pre-read voltages and the quantity of thresholding memory cells to predict a read voltage that may result in the predetermined quantity of memory cells within the disjoint subsets to threshold. By performing the multiple drift determination operations on the disjoint subsets of memory arrays 170 concurrently, read latency may be reduced.

Figure 2:
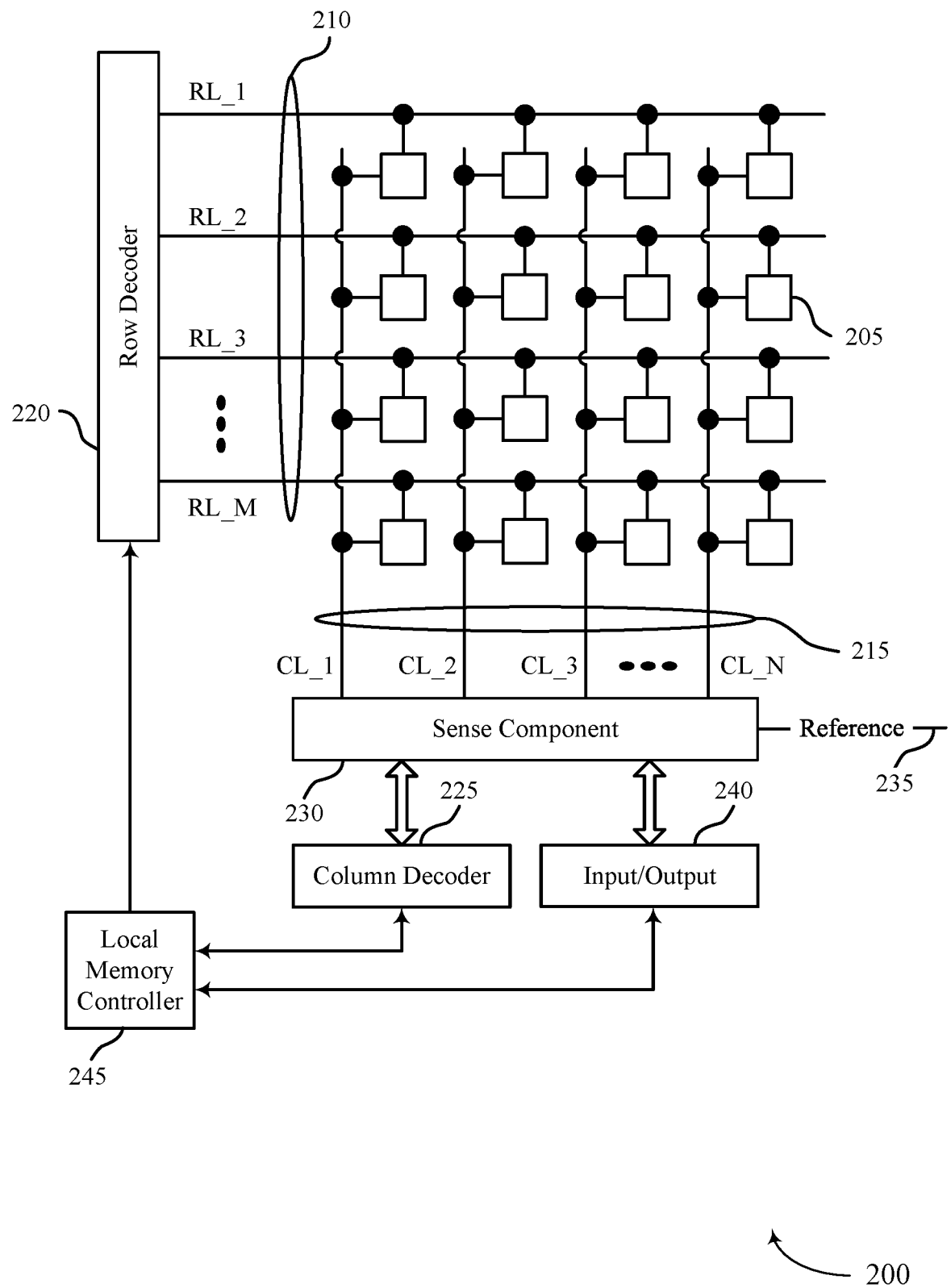
FIG. 2 illustrates an example of a memory die that supports dynamic read voltage techniques in accordance with examples as disclosed herein.

FIG. 2 illustrates an example of a memory die 200 that supports dynamic read voltage techniques in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 260 and activate a row line 210 based on the received row address. A column decoder 225 may receive a column address from the local memory controller 260 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference signal 235 (e.g., a reference voltage). The detected logic state of the memory cell 205 may be provided as an output of the sense component 230 (e.g., to an input/output 240), and may indicate the detected logic state to another component of a memory device that includes the memory die 200. In some examples, the sense component 230 may include a detection circuit. The detection circuit may, in some examples, be configured to detect a quantity of memory cells 205 of a memory array that have a threshold voltage below a voltage (e.g., a pre-read voltage) applied during a read operation.

The local memory controller 260 may control the accessing of memory cells 205 through the various components (e.g., row decoder 220, column decoder 225, sense component 230). The local memory controller 260 may be an example of the local memory controller 165 described with reference to FIG. 1. In some examples, one or more of the row decoder 220, column decoder 225, and sense component 230 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target row line 210 and the target column line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state.

The local memory controller 260 may identify a target memory cell 205 on which to perform the write operation. The local memory controller 260 may identify a target row line 210 and a target column line 215 coupled with the target memory cell 205 (e.g., the address of the target memory cell 205). The local memory controller 260 may activate the target row line 210 and the target column line 215 (e.g., applying a voltage to the row line 210 or column line 215) to access the target memory cell 205. The local memory controller 260 may apply a specific signal (e.g., write pulse) to the column line 215 during the write operation to store a specific state in the storage element of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target row line 210 and a target column line 215 coupled with the target memory cell 205 (e.g., the address of the target memory cell 205). The local memory controller 260 may activate the target row line 210 and the target column line 215 (e.g., applying a voltage to the row line 210 or column line 215) to access the target memory cell 205. The sense component 230 may detect a signal received from the memory cell 205 that is based on the pulse applied to the row line 210, the pulse applied to the column line, and/or a resistance or threshold characteristic of the memory cell 205. The sense component 230 may amplify the signal. The local memory controller 260 may activate the sense component 230 (e.g., latch the sense component) and thereby compare the signal received from the memory cell 205 to the reference signal 235. Based on that comparison, the sense component 230 may determine a logic state that is stored on the memory cell 205. The pulse used as part of the read operation may include one or more voltage levels over a duration.

In some examples, during a read operation, the local memory controller 245 may be operable to perform count-based assessment. During the count-based assessment, the local memory controller 245 may apply a voltage (e.g., a read voltage) to a set of memory arrays (a partition). The applied voltage may increase as a function of time (e.g., multi-step ramp up) and the local memory controller 245 may track a quantity of memory cells that activate in response to the read voltage (have a threshold voltage less than the applied voltage). The local memory controller 245 may compare the quantity of activated memory cells with a predetermined quantity stored in a memory device. When the quantity of activated memory cells matches the predetermined quantity, the local memory controller 245 may stop applying the read voltages to the array of memory cells and determine that all the activated memory cells 205 of the array of memory cells have a first logic state (e.g., SET state). Additionally, the local memory controller 245 may determine that the remaining memory cells have a second logic state (e.g., RESET) state.

As described herein, during a read operation, the local memory controller 245 may be operable to perform concurrent sense operations (e.g., as part of a drift determination operation) on disjoint subsets of the memory arrays (e.g., disjoint subsets of tiles) to determine whether drift has occurred and to determine a read voltage for reading one or more memory cells 205 of the memory arrays. For example, the local memory controller 245 may concurrently apply a first voltage (e.g., a first pre-read voltage) to a first disjoint subset and a second voltage (e.g., a second pre-read voltage) to a second disjoint subset, where the first voltage is different from the second voltage. Here, the memory cells 205 in the first and second disjoint subsets that have a threshold voltage below the respective applied voltages may pass current through the memory cells 205. The local memory controller 245 may detect the current and determine the quantity or percent of memory cells 205 within each of the disjoint subsets that have a threshold voltage below the respective applied voltage of each subset. The memory controller 245 may then compare the quantity or percent of memory cells 205 within each respective disjoint subset to a predetermined quantity of memory cells 205 or percent of memory cells 205 and select a read voltage for the set of memory arrays based on a disjoint subset having a quantity of memory cells 205 that is closest to the predetermined quantity. In another example, the memory controller 245 may not select one of the pre-read voltages as the read voltage for the set of memory arrays, but may instead use the pre-read voltages and the quantity of memory cells that have a threshold voltage below the voltage applied to each disjoint subset to predict a read voltage that may cause the predetermined quantity of memory cells within the disjoint subsets to threshold. That is, each voltage applied to a disjoint subset and the quantity of memory cells that threshold in response may be considered a sample of a population. The memory controller 245 may use these samples to determine global population parameters (e.g., standard deviation) and calculate a read voltage which is expected to cause the predetermined quantity of memory cells to threshold (e.g., have a threshold voltage below the read voltage). The local memory controller 245 may use the selected voltage or the predicted voltage as a read voltage to read the memory cells of the memory arrays.

Figure 3:
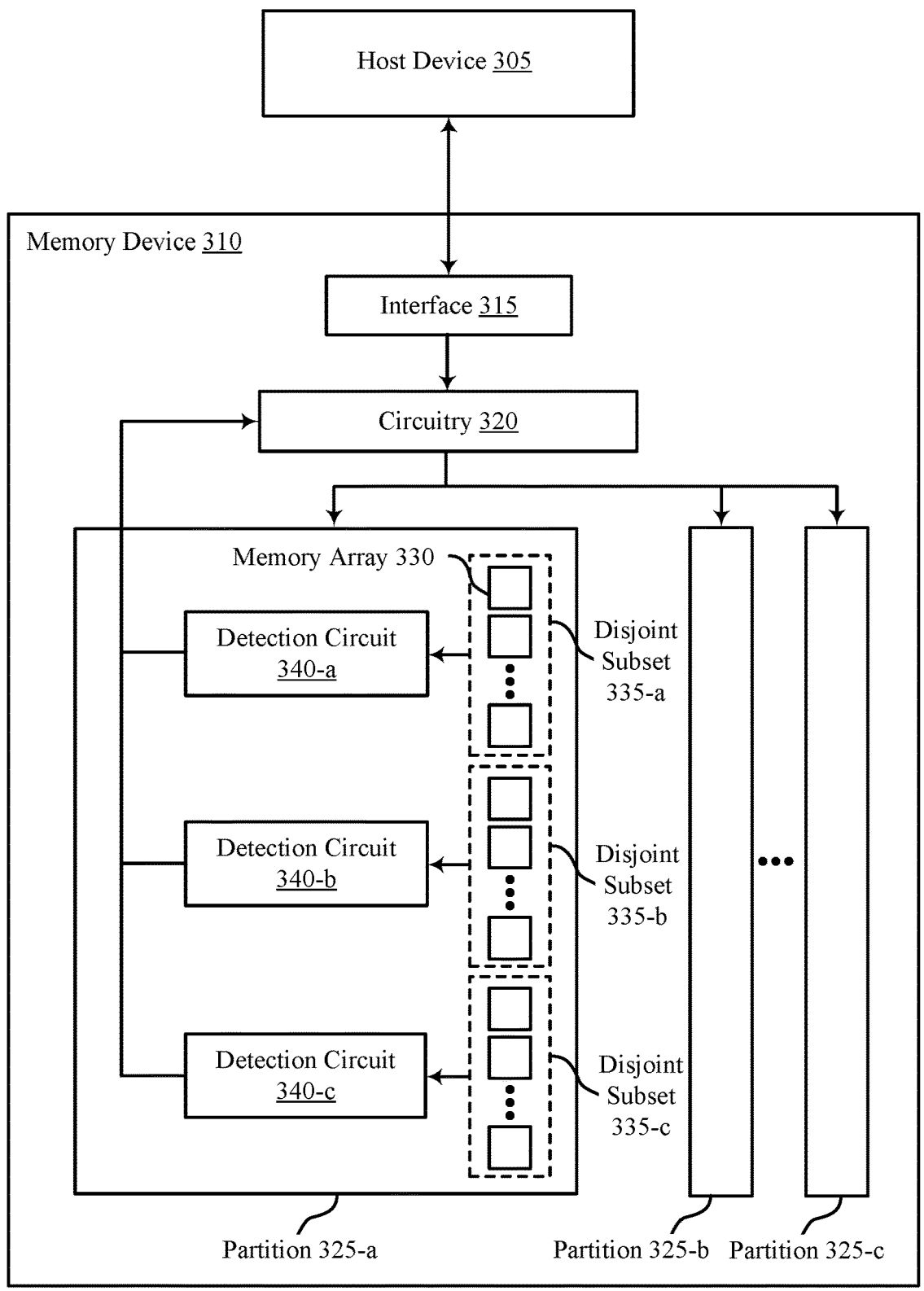
FIG. 3 illustrates an example of a system that support dynamic read voltage techniques in accordance with examples as disclosed herein.

FIG. 3 illustrates an example of a system 300 that supports dynamic read voltage techniques in accordance with examples as disclosed herein. In some examples, a system 300 may implement aspects of the system 100 and memory die 200. For example, the system 300 may include a host device 305 and a memory device 310 which may be examples of a host device 105 and a memory device 110 as described with reference to FIG. 1. Additionally, the system 300 may include memory arrays 330, which may include aspects of memory die 200 as described with reference to FIG. 2.

The memory device 310 may include multiple partitions 325. For example, the memory device 310 may include a partition 325-a, a partition 325-b, and a partition 325-c. Further, each partition 325 may include multiple memory arrays 330 which may otherwise be referred to or related to tiles. As described herein, each of the memory arrays 330 in a partition 325 may be grouped into disjoint subsets 335 (e.g., tile subsets) that each include one or more memory arrays 330. For example, the partition 325-a may include a disjoint subset 335-a, a disjoint subset 335-b, and a disjoint subset 335-c. The memory device 310 may include any quantity of partitions 325 and each disjoint subset 335 may include any quantity of memory arrays 330. For example, each disjoint subset 335 may include 32 memory arrays 330.

In some examples, before performing an access operation on a partition 325 (e.g., in response to an access command received from the host device 305), the memory device 310 may encode data to be stored at the partition 325 such that a predetermined percentage or quantity of memory cells in each disjoint subset 335 of the partition 325 have a certain logic state. For example, the memory device 310 may encode data such that 50% of the memory cells in each disjoint subset 335 have a first logic state (e.g., SET state) and 50% of the memory cells in each disjoint subset 335 have a second logic state (e.g., RESET state). In some examples, the memory cells of the partition 325 may be configured to store more than one logic state (e.g., if the memory cells are multi-level cells (MLCs)).

The memory device 310 may perform an access operation on one or more of the partitions 325. For example, the host device 305 may transmit a read command to the memory device 310 via an interface 315, where the read command indicates for the memory device 310 to perform a read operation on one or more partitions 325. Upon receiving the read command from the host device 305, the memory device 105 may perform a drift determination operation at each of the disjoint subsets 335 within the one or more partitions 325 indicated by the read command. That is, the circuitry 320 may apply different pre-read voltages to each disjoint subset 335 within the one or more partitions 325. For example, if the read command indicates the partition 325-a, the circuitry 320 may apply a first voltage to the disjoint subset 335-a, a second voltage to the disjoint subset 335-b, and a third voltage to the disjoint subset 335-c. The circuitry 320 may include components for performing access operations such access lines (e.g., digit lines or word lines), capacitors, sense components, sense amplifiers, amplifiers, etc. In some examples, the set of voltages (e.g., the first voltage, the second voltage, and the third voltage) applied to disjoint subsets 335 may be preconfigured or determined by the interface 315 based on a read command received from the host device 305. Alternatively, the set of voltages may be determined from prior testing. In some examples, each voltage of the set of voltages may be distinct from one another. For example, the second voltage may be greater than the first voltage and the third voltage may be greater than the second voltage. To apply the different voltage levels (e.g., first voltage, second voltage, and third voltage), each of the disjoint subsets 335 may be coupled with a respective boosted capacitor.

In response to the applied voltages, one or more memory cells of each disjoint subset 335 of the partition 325 may threshold. That is, the applied voltage may exceed a threshold voltage associated with the one or more memory cells causing a current to run through the one or memory cells. A presence of current may indicate a first logic state is stored on the one or more memory cells (e.g., SET state). In some examples, a detection circuit 340 may be coupled to each of the disjoint subsets 335 and may be configured to determine a percentage or quantity of memory cells that threshold during the drift determination phase. In one example, a detection circuit 340-a may determine 30% of the memory cells of disjoint subset 335-a are associated with the first logic state. Moreover, a detection circuit 340-b may determine 40% of the memory cells of disjoint subset 335-b are associated with the first logic state. Additionally, a detection circuit 340-c may determine 50% of the memory cells of disjoint subset 335-c are associated with the first logic state. In a another example, the detection circuit 340-a may determine 2.275% of the memory cells of disjoint subset 335-a are associated with the first logic state. Moreover, the detection circuit 340-b may determine 15.875% of the memory cells of disjoint subset 335-b are associated with the first logic state. Additionally, the detection circuit 340-c may determine 20.5% of the memory cells of disjoint subset 335-c are associated with the first logic state.

The detection circuits 340 may communicate an indication of the determined quantity of memory cells to the circuitry 320. Based on the quantity of memory cells within each disjoint subset 335 that threshold in response to the respective applied pre-read voltage, the circuitry 320 may select a read voltage for reading the memory cells of the partition 325. In some examples, the circuitry 320 may select the voltage applied to the disjoint subsets 335 during the drift determination phase that results in a percentage or quantity of memory cells to threshold most similar to the predetermined percentage or quantity of memory cells to be the read voltage. For example, if one of the voltages applied to the disjoint subsets 335 during the drift determination phase results in the predetermined percentage or quantity of memory cells thresholding (e.g., 50% of the memory cells thresholding), the circuitry may select this voltage to the be the read voltage for the read operation.

In another example, the circuitry 320 may select the voltage to apply to the partition 325 based on an identified relationship between a quantity of memory cells within each disjoint subset 335 that threshold and a magnitude of the pre-read voltage applied to that disjoint subset. For example, each detection circuit 340-a may indicate the quantity of memory cells to the circuitry 320 using thresholding bits. That is, the circuitry 320 may count the thresholding bits from each detection circuit 340 to determine the quantity of memory cells that threshold in each disjoint subset 335 of the partition 325-a. In some examples, the circuitry 320 may identify a slope of the thresholding bit count versus the voltage applied to each disjoint subset 335. If the slope does not exceed a threshold, the circuitry 320 may determine not to apply the selected voltage as the read voltage for subsequent reading of partition 325-a. Alternatively or additionally, the circuitry may determine a projected voltage which may cause the predetermined quantity of memory cells to snap or threshold based on the slope (e.g., predicted) and utilize the projected voltage as the read voltage for a subsequent reading of partition 325-a. In another example, the circuitry 320 may predict the read voltage using population statistics. That is, the circuitry 320 may treat each disjoint subset 335 as a samples in a population and predict the read voltage based on these samples.

After selecting the read voltage, the memory device 310 may perform a read operation on the partition 325-a. That is, the memory device 310 may apply the selected read voltage to the partition 325-a and sense a logic state of one or more memory cells of the partition 325-a. In some examples, the memory device 310 may include MLCs. That is, memory cells that store more than one bit of data. In such case, the memory device 310 may apply the selected read voltage at a first polarity to the memory partition 325-a for a first duration and apply the selected read voltage at a second polarity for a second duration. Thus, the memory device 310 may determine a set of values (e.g., a codeword) stored at the partition 325-a. In some cases, the memory device 310 may communicate the determined set of values to the host device 305 (e.g., via the interface 315). For example, in a case that the memory device 310 performs the read operation at the partition 325-a in response to receiving a read command from the host device 305, the memory device 310 may communicate the determined set of values stored at the partition 325-a to the host device 305 after performing the read operation.

Figure 4:
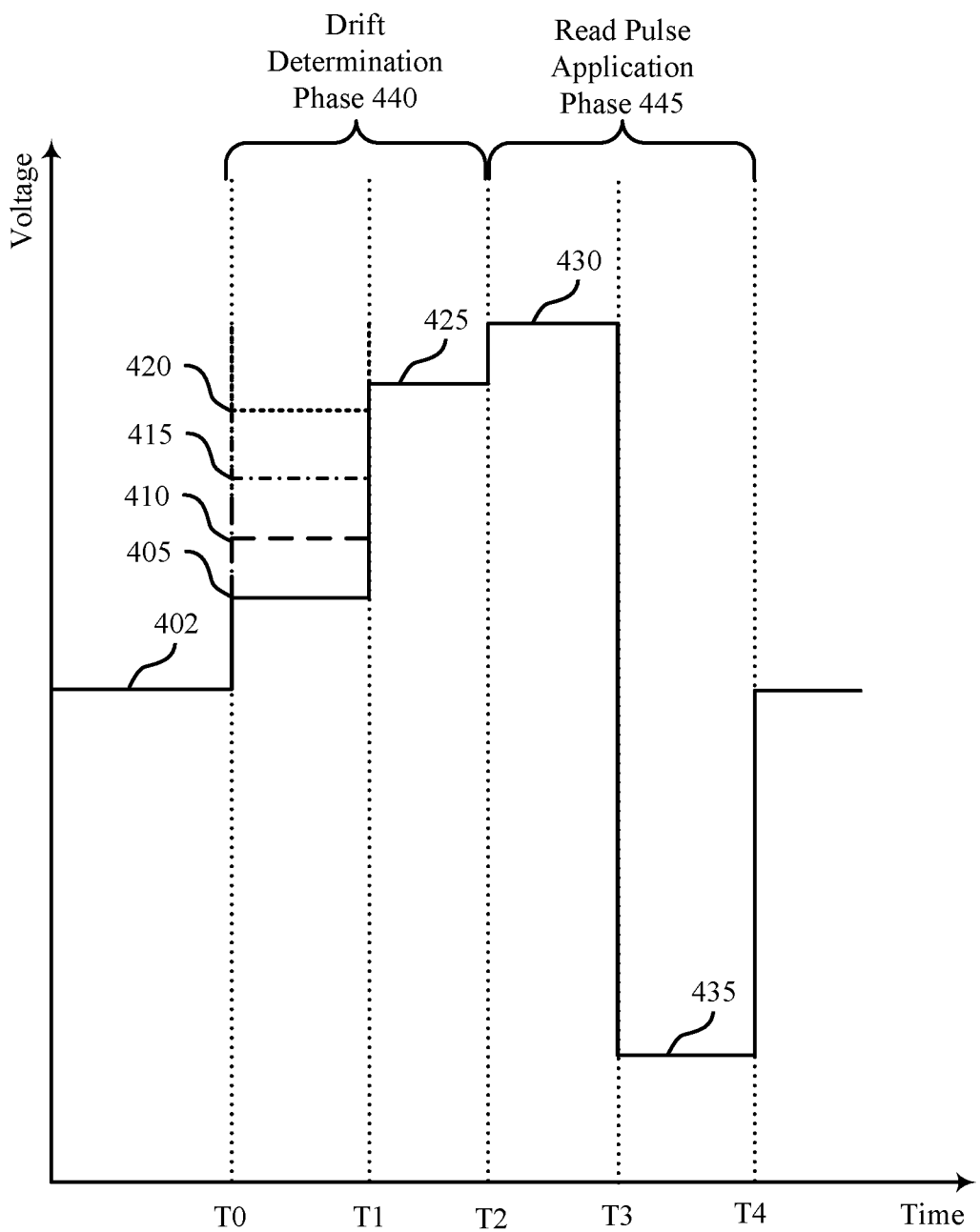
FIG. 4 illustrates an example of a timing diagram that supports dynamic read voltage techniques in accordance with examples as disclosed herein.

FIG. 4 illustrates an example of a timing diagram 400 that supports dynamic read voltage techniques in accordance with examples as disclosed herein. Timing diagram 400 may illustrate different voltages applied to various components (e.g., partitions or disjoint subsets) by circuitry during a read operation at a partition of a memory device as described herein. For example, timing diagram 400 may illustrate applying voltages 405, 410, 415, and 420 to respective disjoint subsets of the partition during a portion of a drift determination phase 440 (T0 to T1) and applying a voltage 430 to the partition during a read pulse application phase 445 (T2 to T4).

Before a read operation, the memory device may store data at the partition, where the data includes a predetermined amount or percentage of bits associated with a first logic state and a predetermined amount or percentage of bits associated with a second logic state. For example, the memory device may employ an encoding scheme ensuring 50% of the data includes bits associated with a SET state and 50% of the data includes bits associated with a RESET state. In some examples, the memory cells of the partition may be configured to store one bit of data (e.g., SLCs) or more than one bit of data (e.g., MLCs).

Before T0, the memory device may not apply a voltage across memory cells within each disjoint subset of the partition. For example, the memory cells within each disjoint subset of the partition may be biased to a ground voltage 402. In some examples, before T0, a memory device may receive a read command from a host device to perform a read operation on the partition of the memory device.

If the memory device receives a read command from the host device, the memory device may enter a drift determination phase 440. For example, at T0, the memory device may apply voltage 405 to a first disjoint subset of the partition, a voltage 410 to a second disjoint subset of the partition, a voltage 415 to a third disjoint subset of the partition, and a voltage 420 to a fourth disjoint subset of the partition. In some example, the voltage 405, the voltage 410, the voltage 415, and the voltage 420 may be applied to the respective disjoint subsets via digit lines coupled to the respective disjoint subsets. In response to the applied voltages, one or more memory cells of each disjoint subset may threshold (e.g., the applied voltages may exceed the threshold voltages of the one or more memory cells inducing a current through the memory cell). In some examples, one or more of the pre-read voltages (e.g., 405, 410, 415 or 420) may be greater than the voltage 430 applied to the partition during the read pulse application phase 445.

At time T1, the memory device may detect a percentage of memory cells in each disjoint subset that threshold in response to the respective voltage applied to that disjoint subset from time T0 to time T1. For example, the memory device may include a set of detection circuits, where each detection circuit of the set is coupled to each respective disjoint subset. The detection circuit may, for example, detect 30% of memory cells in the first disjoint subset threshold, 35% of memory cells in the second disjoint subset threshold, 42% of memory cells in the third disjoint subset threshold, and 48% of memory cells in the fourth disjoint subset threshold. In some examples, the detection circuit may, for example, detect more than the predetermined quantity (e.g., 50%) of memory cells in a disjoint subset thresholding in response to one or more of the pre-read voltages 405, 410, 415, and 420 applied to that disjoint subset. In addition, the detection circuit may indicate the percentage of thresholding memory cells of each disjoint subset to circuitry of the memory device.

The circuitry of the memory device may compare the percentage of thresholding memory cells to the predetermined percentage of memory cells and select a read voltage 430 for a subsequent reading of the partition. In one example, the circuitry may select a voltage based on extrapolating data related to the quantity of thresholding memory cells detected in response to the various voltages 405, 410, 415, and 420 applied during the drift determination phase 440. That is, the circuitry may use the pre-read voltages 405, 410, 415, and 420 and the quantity of thresholding memory cells to predict a read voltage 430 that may result in the predetermined quantity of memory cells within the disjoint subsets to threshold. For example, based on detecting 30% of memory cells in the first disjoint subset thresholding, 35% of memory cells in the second disjoint subset thresholding, 42% of memory cells in the third disjoint subset thresholding, and 48% of memory cells in the fourth disjoint subset thresholding, the memory device may select a read voltage 430 that is slightly higher than the voltage 420 resulting in 48% of the memory cells thresholding. In another example, the memory device may select a read voltage 430 based on one or more pre-read voltages 405, 410, 415, or 420 that cause more than the predetermined quantity (e.g., 50%) of memory cells within a disjoint subset to threshold. Here, the memory device may select a read voltage 430 that is lower than the voltage 405, 410, 415, or 420 that causes more than the predetermined quantity of memory cells within the disjoint subset to threshold. In some cases, the circuitry may select the voltage based on a lookup table indicating an association between the quantity of thresholding memory cells within each disjoint subset and a predicted read voltage that may result in the predetermined quantity of memory cells thresholding during the read operation.

In another example, the memory device may select a voltage from the set of voltages applied during the drift determination phase 440 and utilize the selected voltage to read the partition. For example, in a case that one of the voltages applied to a disjoint subset at T0 (e.g., voltage 420) causes the predetermined quantity (e.g., 50%) of the memory cells to threshold, the circuitry may select that voltage for the read voltage 430.

In some examples, the process of detecting the percentage of thresholding memory cells and selecting the read voltage may last several clock cycles. For example, the process may start at T1 and end at T2. During this time (T1 to T2), the memory device may prepare to read the partition. That is, the memory device may ramp up the voltage from a low voltage (e.g., ground voltage) to voltage 425. Voltage 425 may in some cases be less than the selected voltage (e.g., voltage 420). In some cases, ramping up the voltage to the voltage 425 may reduce latency related to the ramp up of the read voltage to the selected voltage during a read operation. In some examples, the voltage 425 may be ramped to an expected read voltage (e.g., read voltage of a previous read operation) and adjusted to the read voltage selected or predicted during the drift determination phase. It may be noted that the ramp up process (e.g., T1 to T2) is optional and the methods described herein may be performed without the ramp up process.

At T2, the memory device may perform a read operation by beginning a read pulse application phase 445. That is, the memory device may apply a first read voltage pulse to the memory cells within the partition by applying the voltage 430 to the partition. In some example, the voltage 430 may be the same as the selected voltage (e.g., voltage 420). In other examples, the voltage 430 may be greater than one or more of voltages 405, 410, 415, and 420 (e.g., when the read voltage is predicted based on extrapolating the quantity of thresholding memory cells in response to applying voltages 405, 410, 415, and 420). The memory device may apply the voltage 430 to the partition and sense a logic state of one or more memory cells of the partition. In the case the partition includes MLCs, the memory device may apply the voltage 430 using a first polarity (e.g., Pol-1) from T2 to T3 and apply the voltage 430 using a second polarity (e.g., Pol-0) from T3 to T4. At T4, the read voltage may be biased to a low voltage. For example, the read voltage may be biased to a ground voltage.

As described herein, a memory device may apply a single sense operation (apply a pre-read voltage) to multiple disjoint subsets of memory arrays (e.g., disjoint subset of tiles) of a partition simultaneously to determine drift and select a read voltage for subsequent read operations. By performing a single sense operation on multiple disjoint subsets of memory arrays (e.g., within a single drift determination phase 440), a memory device may decrease latency when compared to performing multiple sequential sense operations across two or more partitions as described in other method. In additions, as opposed to other methods, the memory device may determine drift or a select a read voltage using a single partition. As such, the method described herein may be applied when accessing single partition codewords.

Figure 5:
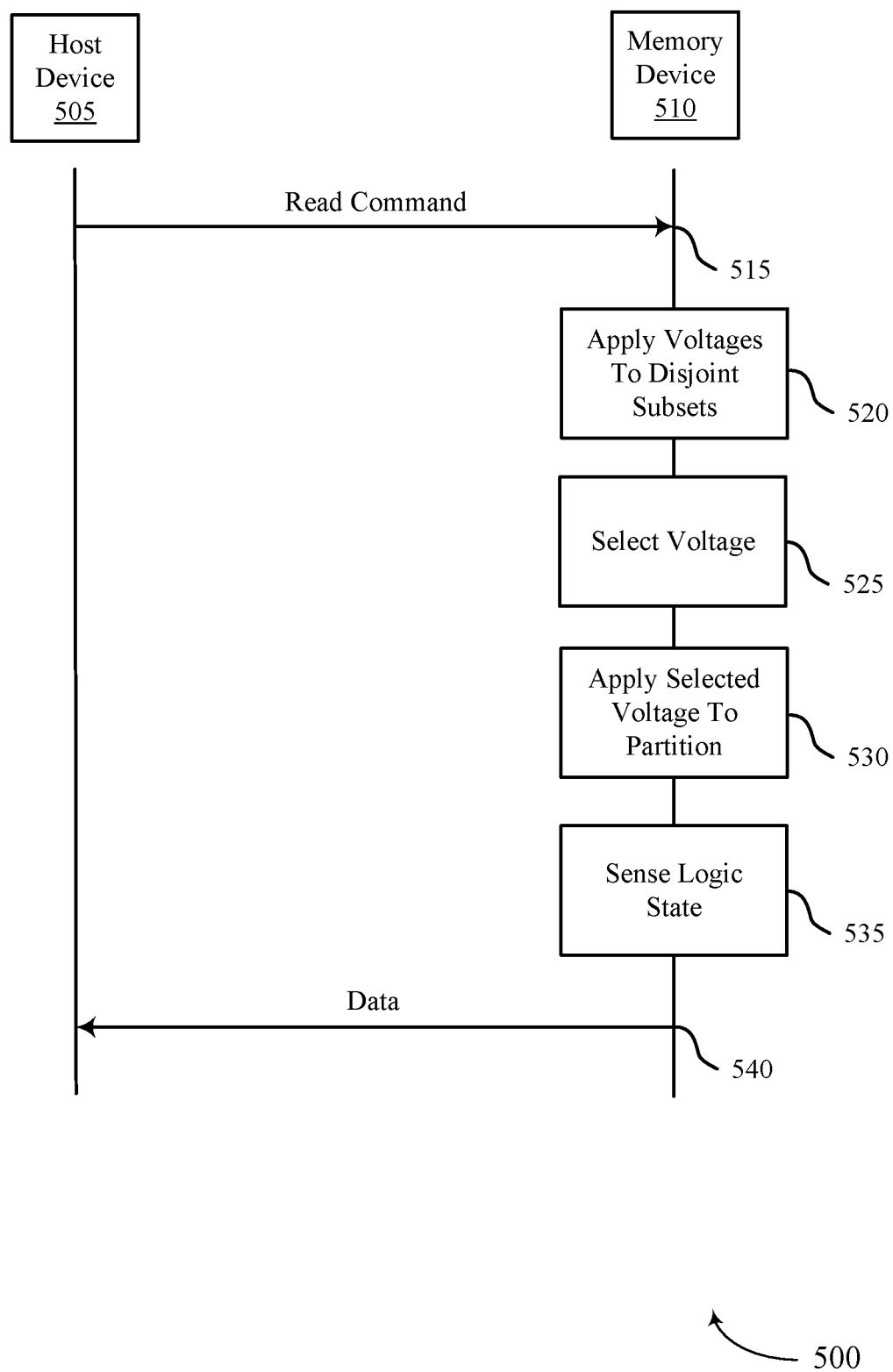
FIG. 5 illustrates an example of a process flow that supports dynamic read voltage techniques in accordance with examples as disclosed herein.

FIG. 5 illustrates an example of a process flow 500 that supports dynamic read voltage techniques in accordance with examples as disclosed herein. In some examples, the process flow may implement aspects of a system 100 and a system 300. For example, the process flow 500 may include a host device 505 and a memory device 520 which may be examples, of a host device and a memory device as described with reference to FIGS. 1 and 3. The process flow 500 may be implemented to determine a voltage for reading one or more partitions in the presence of drift. Alternative examples of the following may be implemented, where some steps are performed in a different order than described or are not performed at all. In some cases, steps may include additional features not mentioned below, or further steps may be added.

At 515, a memory device 510 may receive a read command from a host device 505. The read command may instruct the memory device 510 to perform a read operation on one or more partitions of the memory device 510. In some examples, the one or more partitions may include multiple disjoint subsets of memory arrays. In some cases, before 515, the memory device may apply an encoding scheme such that a predetermined percentage or amount of memory cells in the disjoint subsets store some logic state as described with reference to FIGS. 2 and 3.

At 520, the memory device may apply a respective voltage of a set of voltages to each of disjoint subsets of the one or more partitions. In some examples, each respective voltage may be different. For example, a voltage applied to a first disjoint subset may be less than or more than a voltage applied to a second disjoint subset. In some examples, the memory device may apply a voltage to each of the disjoint subsets of the one or more partitions using circuitry such as access lines. In some examples, the memory device 510 may apply the voltages to the respective disjoint subsets concurrently or during a same or overlapping duration.

At 525, the memory device 510 may select a voltage from the set of voltage or select a predicted voltage determined from the set of voltages to be the read voltage for the read operation. In some examples, the memory device may include a set of detection circuits, where each detection circuit of the set is coupled to each of the disjoint subsets. The detection circuit may detect a percentage of memory cells of a respective disjoint subset having a threshold voltage that is lower than the respective voltage applied at 520 (how many memory cells may threshold) and send percentage information associated with the respective disjoint subset to circuitry located in the memory device 310. The circuitry may include logic which may compare the percentage information across all of the all disjoint subsets of the one or more partitions and select a voltage corresponding to the percentage information most resembling the predetermined percentage discussed at 515. For example, the circuitry may include logic which to predict a voltage (e.g., based on extrapolating) that causes the predetermined percentage of memory cells to threshold based on the set of voltages applied at 520 and select that predicted voltage as the read voltage for subsequent read operations. In another example, the circuitry may select one of the set of voltages (e.g., in a case that one of the set of voltages resulted in the predetermined quantity of memory cells thresholding).

At 530, the memory device may perform the read operation and apply the selected voltage to the one or more partitions. In some examples, the memory device 310 may apply the selected voltage using a first polarity for a first duration and apply the selected voltage using a second polarity. In some example, the memory device may apply the selected voltage using circuitry included at the memory device, where the circuitry may include access lines.

At 535, the memory device may sense a logic state of one or more of the memory cells of the one or more partitions. In some example, the memory device 510 may sense a logic state of one or more memory cells based on the characteristics of the one or more memory cells after applying the selected voltage at 525 (e.g., resistivity, presence/absence of current, threshold voltage, etc.).

At 540, the memory device 510 may send data to the host device 505. The data may include bits corresponding to the logic states sensed at 535.

Figure 6:
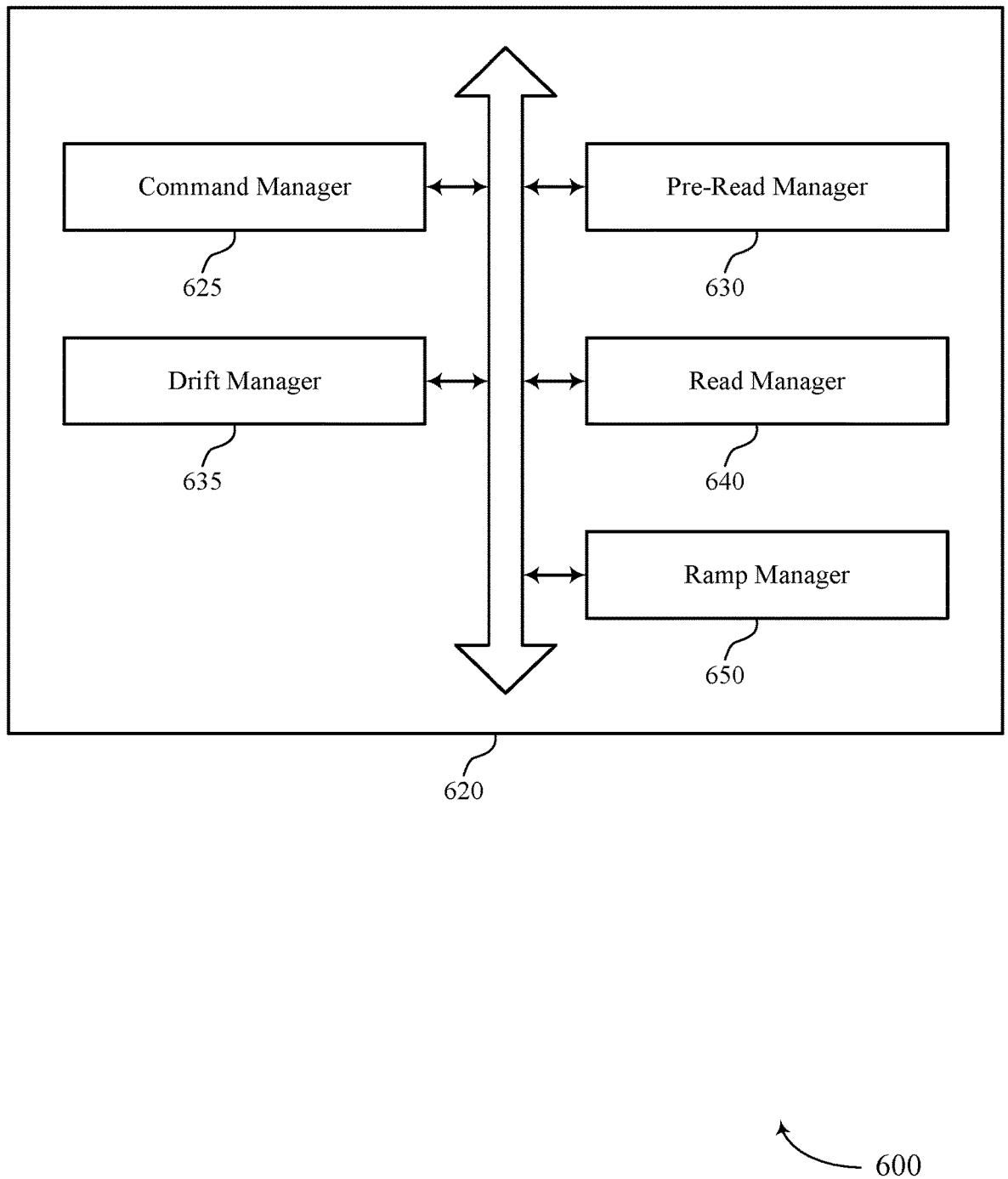
FIG. 6 shows a block diagram of a memory device that supports dynamic read voltage techniques in accordance with examples as disclosed herein.

FIG. 6 shows a block diagram 600 of a memory device 620 that supports dynamic read voltage techniques in accordance with examples as disclosed herein. The memory device 620 may be an example of aspects of a memory device as described with reference to FIGS. 1 through 5. The memory device 620, or various components thereof, may be an example of means for performing various aspects of dynamic read voltage techniques as described herein. For example, the memory device 620 may include a command manager 625, a pre-read manager 630, a drift manager 635, a read manager 640, a ramp manager 650, or any combination thereof. Each of these components may communicate, directly or indirectly, with one another (e.g., via one or more buses).

The command manager 625 may be configured as or otherwise support a means for receiving a read command to perform a read operation on a plurality of memory arrays, the plurality of memory arrays including disjoint subsets. The pre-read manager 630 may be configured as or otherwise support a means for applying a respective one of a plurality of voltages to each respective disjoint subset of the disjoint subsets based at least in part on receiving the read command to perform the read operation. The drift manager 635 may be configured as or otherwise support a means for selecting a voltage to apply to the plurality of memory arrays during an execution of the read operation based at least in part on applying the respective one of the plurality of voltages to each respective disjoint subset. The read manager 640 may be configured as or otherwise support a means for applying the selected voltage to the plurality of memory arrays to execute the read operation.

In some examples, to support applying the respective one of the plurality of voltages to each respective disjoint subset, the pre-read manager 630 may be configured as or otherwise support a means for applying two or more of the plurality of voltages to the respective disjoint subsets concurrently.

In some examples, the drift manager 635 may be configured as or otherwise support a means for identifying, for each of the disjoint subsets and based at least in part on applying the plurality of voltages, a quantity of memory cells within each disjoint subset having a threshold voltage that is less than the respective one of the plurality of voltages applied to each disjoint subset, where selecting the voltage is based at least in part on identifying the quantity of memory cells within each disjoint subset.

In some examples, the ramp manager 650 may be configured as or otherwise support a means for applying, during a first time interval that at least partially overlaps with a second time interval associated with identifying the quantity of memory cells, a second voltage to the plurality of memory arrays, where applying the selected voltage is based at least in part on applying the second voltage.

In some examples, a first magnitude of the second voltage is less than or equal to a second magnitude of the selected voltage.

In some examples, to support selecting the voltage, the drift manager 635 may be configured as or otherwise support a means for selecting the voltage based at least in part on an association between the identified quantity of memory cells within each disjoint subset and the respective one of the plurality of voltages applied to each disjoint subset.

In some examples, the drift manager 635 may be configured as or otherwise support a means for determining that a quantity of memory cells within a first disjoint subset having a threshold voltage that is less than a first voltage of the plurality of voltages applied to the first disjoint subset satisfies a criterion. In some cases, selecting the voltage may include predicting a voltage (e.g., based on extrapolating, based on a projection) that will result in the predetermined quantity of the memory cells thresholding. In some other cases, selecting the voltage from the plurality of voltages may include selecting the first voltage from the plurality of voltages (e.g., where the first voltage causes the predetermined quantity of memory cells to threshold).

In some examples, the criterion includes a ratio of first memory cells within each disjoint subset having a threshold voltage that is less than the respective one of the plurality of voltages applied to each disjoint subset and second memory cells within each disjoint subset having a threshold voltage that is greater than the respective one of the plurality of voltages applied to each disjoint subset.

In some examples, to support selecting the voltage to apply to the plurality of memory arrays during the execution of the read operation, the drift manager 635 may be configured as or otherwise support a means for selecting a magnitude of the voltage to apply to the plurality of memory arrays. In some examples, to support applying the selected voltage to the plurality of memory arrays, the read manager 640 may be configured as or otherwise support a means for applying a first voltage pulse having the magnitude and a first polarity and the read manager 640 may be configured as or otherwise support a means for applying a second voltage pulse having the magnitude and a second polarity different than the first polarity.

In some examples, the plurality of memory arrays corresponds to a partition of the memory device. In some examples, each memory array corresponds to a respective tile of the memory device.

Figure 7:
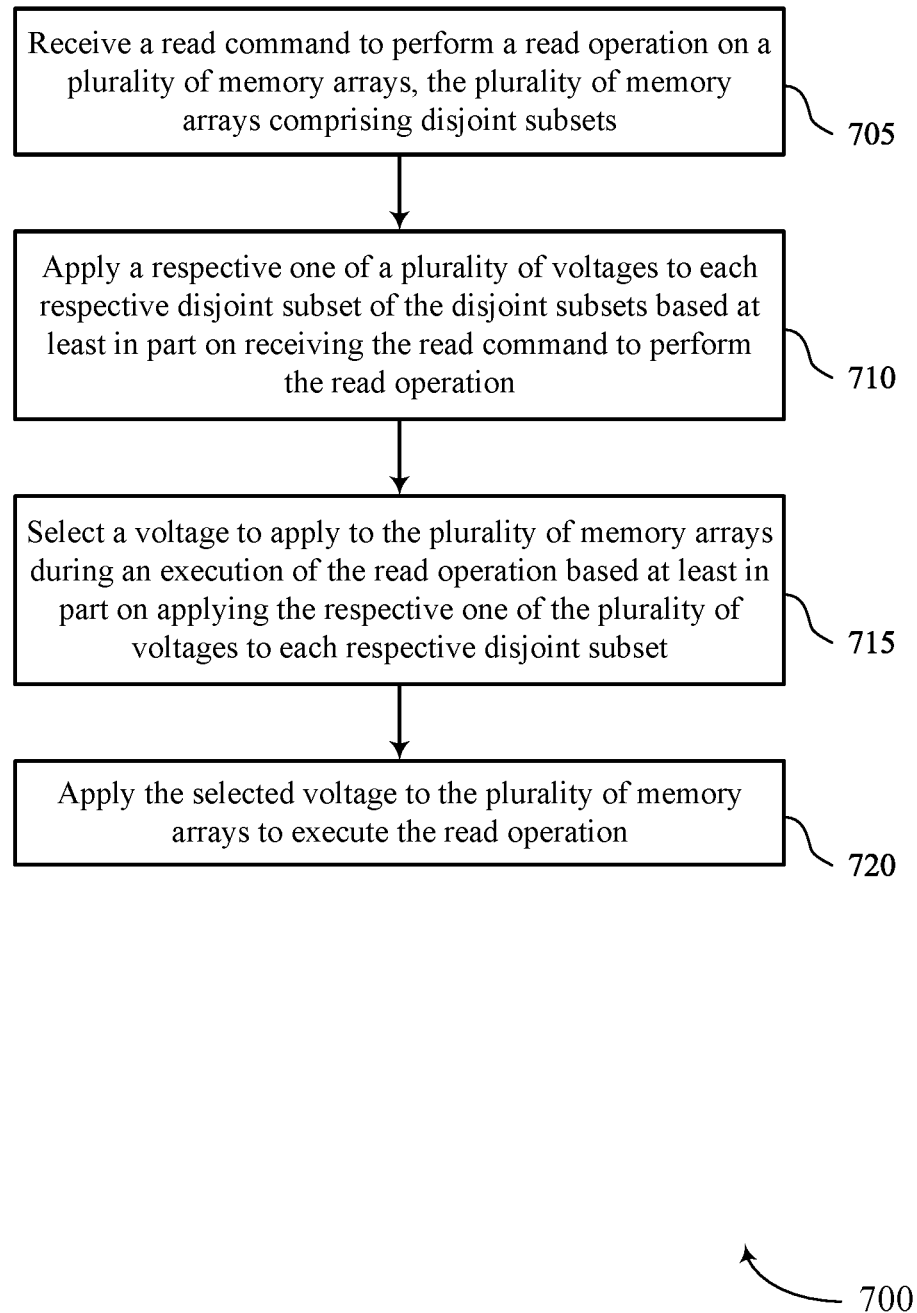
FIG. 7 shows a flowchart illustrating a method or methods that support dynamic read voltage techniques in accordance with examples as disclosed herein.

FIG. 7 shows a flowchart illustrating a method 700 that supports dynamic read voltage techniques in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally or alternatively, the memory device may perform aspects of the described functions using special-purpose hardware.

At 705, the method may include receiving a read command to perform a read operation on a plurality of memory arrays, the plurality of memory arrays including disjoint subsets. The operations of 705 may be performed in accordance with examples as disclosed herein. In some examples, aspects of the operations of 705 may be performed by a command manager 625 as described with reference to FIG. 6.

At 710, the method may include applying a respective one of a plurality of voltages to each respective disjoint subset of the disjoint subsets based at least in part on receiving the read command to perform the read operation. The operations of 710 may be performed in accordance with examples as disclosed herein. In some examples, aspects of the operations of 710 may be performed by a pre-read manager 630 as described with reference to FIG. 6.

At 715, the method may include selecting a voltage to apply to the plurality of memory arrays during an execution of the read operation based at least in part on applying the respective one of the plurality of voltages to each respective disjoint subset. For example, the method may include selecting the voltage to apply based on projecting that the selected voltage causes the predetermined quantity of memory cells to threshold. The operations of 715 may be performed in accordance with examples as disclosed herein. In some examples, aspects of the operations of 715 may be performed by a drift manager 635 as described with reference to FIG. 6.

At 720, the method may include applying the selected voltage to the plurality of memory arrays to execute the read operation. The operations of 720 may be performed in accordance with examples as disclosed herein. In some examples, aspects of the operations of 720 may be performed by a read manager 640 as described with reference to FIG. 6.

In some examples, an apparatus as described herein may perform a method or methods, such as the method 700. The apparatus may include, features, circuitry, logic, means, or instructions (e.g., a non-transitory computer-readable medium storing instructions executable by a processor) for receiving a read command to perform a read operation on a plurality of memory arrays, the plurality of memory arrays including disjoint subsets, applying a respective one of a plurality of voltages to each respective disjoint subset of the disjoint subsets based at least in part on receiving the read command to perform the read operation, selecting a voltage to apply to the plurality of memory arrays during an execution of the read operation based at least in part on applying the respective one of the plurality of voltages to each respective disjoint subset, and applying the selected voltage to the plurality of memory arrays to execute the read operation.

In some examples of the method 700 and the apparatus described herein, applying the respective one of the plurality of voltages to each respective disjoint subset may include operations, features, circuitry, logic, means, or instructions for applying two or more of the plurality of voltages to the respective disjoint subsets concurrently.

Some examples of the method 700 and the apparatus described herein may further include operations, features, circuitry, logic, means, or instructions for identifying, for each of the disjoint subsets and based at least in part on applying the plurality of voltages, a quantity of memory cells within each disjoint subset having a threshold voltage that may be less than the respective one of the plurality of voltages applied to each disjoint subset, where selecting the voltage may be based at least in part on identifying the quantity of memory cells within each disjoint subset.

Some examples of the method 700 and the apparatus described herein may further include operations, features, circuitry, logic, means, or instructions for applying, during a first time interval that at least partially overlaps with a second time interval associated with identifying the quantity of memory cells, a second voltage to the plurality of memory arrays, where applying the selected voltage may be based at least in part on applying the second voltage.

In some examples of the method 700 and the apparatus described herein, a first magnitude of the second voltage may be less than or equal to a second magnitude of the selected voltage.

In some examples of the method 700 and the apparatus described herein, selecting the voltage may include operations, features, circuitry, logic, means, or instructions for selecting the voltage based at least in part on an association between the identified quantity of memory cells within each disjoint subset and the respective one of the plurality of voltages applied to each disjoint subset. In some other examples of the method 700 and the apparatus described herein, selecting the voltage may include operations, features, circuitry, logic, means, or instructions for selecting the voltage based at least in part on an extrapolation or projection between the identified quantity of memory cells within each disjoint subset and the respective one of the plurality of voltages applied to each disjoint subset.

Some examples of the method 700 and the apparatus described herein may further include operations, features, circuitry, logic, means, or instructions for determining that a quantity of memory cells within a first disjoint subset having a threshold voltage that may be less than a first voltage of the plurality of voltages applied to the first disjoint subset satisfies a criterion, where selecting the voltage from the plurality of voltages includes selecting the first voltage from the plurality of voltages (e.g., in cases that the first voltage results in the predetermined quantity of memory cells thresholding).

In some examples of the method 700 and the apparatus described herein, the criterion includes a ratio of first memory cells within each disjoint subset having a threshold voltage that may be less than the respective one of the plurality of voltages applied to each disjoint subset and second memory cells within each disjoint subset having a threshold voltage that may be greater than the respective one of the plurality of voltages applied to each disjoint subset.

In some examples of the method 700 and the apparatus described herein, selecting the voltage to apply to the plurality of memory arrays during the execution of the read operation may include operations, features, circuitry, logic, means, or instructions for selecting a magnitude of the voltage to apply to the plurality of memory arrays and applying the selected voltage to the plurality of memory arrays may include operations, features, circuitry, logic, means, or instructions for applying a first voltage pulse having the magnitude and a first polarity and applying a second voltage pulse having the magnitude and a second polarity different than the first polarity.

In some examples of the method 700 and the apparatus described herein, the plurality of memory arrays corresponds to a partition of the memory device and each memory array corresponds to a respective tile of the memory device.

It should be noted that the methods described herein describe possible implementations, and that the operations and the steps may be rearranged or otherwise modified and that other implementations are possible. Furthermore, portions from two or more of the methods may be combined.

Another apparatus is described. The apparatus may include a plurality of memory arrays each including disjoint subsets of memory cells, an interface coupled with the plurality of memory arrays and a host device, the interface configured to receive a read command to perform a read operation on the plurality of memory arrays, and circuitry coupled with each of the plurality of memory arrays and configured to apply a respective one of a plurality of voltages to each respective disjoint subset of the disjoint subsets based at least in part on receiving the read command to perform the read operation, select a voltage to apply to the plurality of memory arrays during an execution of the read operation based at least in part on applying the respective one of the plurality of voltages to each respective disjoint subset, and apply a selected voltage to the plurality of memory arrays to execute the read operation.

In some examples, the apparatus may be configured to apply two or more of the plurality of voltages to the respective disjoint subsets concurrently.

In some examples, the apparatus may include a plurality of detection circuits each coupled with a respective disjoint subset of the disjoint subsets, where each detection circuit may be configured to identify, based at least in part on the circuitry applying the respective one of the plurality of voltages, a quantity of memory cells within the respective disjoint subset having a threshold voltage that may be less than the respective one of the plurality of voltages applied to the respective disjoint subset, where selecting the voltage may be based at least in part on identifying the quantity of memory cells with the respective disjoint subset.

In some examples, the apparatus may be configured to apply, during a first time interval that at least partially overlaps with a second time interval associated with identifying the quantity of memory cells, a second voltage to the plurality of memory arrays, where applying the selected voltage may be based at least in part on applying the second voltage.

In some examples of the apparatus, a first magnitude of the second voltage may be less than or equal to a second magnitude of the selected voltage.

In some examples, the apparatus may include selecting the voltage based at least in part on an association (e.g., a linear association) between the identified quantity of memory cells within each disjoint subset and the respective one of the plurality of voltages applied to each disjoint subset. Additionally, the apparatus may include selecting the voltage based at least in part on a lookup table indicating an association between the identified quantity of memory cells within each disjoint subset and the respective one of the plurality of voltages applied to each disjoint subset.

In some examples, the apparatus may include a detection circuit coupled with a first disjoint subset and configured to determine that a quantity of memory cells within the first disjoint subset having a threshold voltage that may be less than a first voltage of the plurality of voltages applied to the first disjoint subset satisfies a criterion, where selecting the voltage from the plurality of voltages includes selecting the first voltage from the plurality of voltages (e.g., in cases that applying the first voltage to a disjoint subset results in the predetermined quantity of memory cells thresholding). Additionally, selecting the voltage may include selecting a different voltage than the plurality of voltages based on identifying a voltage that is predicted to cause the predetermined quantity of memory cells to threshold.

In some examples of the apparatus, the criterion includes a ratio of first memory cells within each disjoint subset having a threshold voltage that may be less than the respective one of the plurality of voltages applied to each disjoint subset and second memory cells within each disjoint subset having a threshold voltage that may be greater than the respective one of the plurality of voltages applied to each disjoint subset.

In some examples, the apparatus may be configured to select a magnitude of the voltage to apply to the plurality of memory arrays, apply a first voltage pulse having the magnitude and a first polarity, and apply a second voltage pulse having the magnitude and a second polarity different than the first polarity.

In some examples of the apparatus, the plurality of memory arrays corresponds to a partition of the apparatus and each memory array corresponds to a respective tile of the apparatus.

Another apparatus is described. The apparatus may include a controller configured to cause the apparatus to receive a read command to perform a read operation on a plurality of memory arrays, the plurality of memory arrays including disjoint subsets, apply a respective one of a plurality of voltages to each respective disjoint subset of the disjoint subsets based at least in part on receiving the read command to perform the read operation, select a voltage to apply to the plurality of memory arrays during an execution of the read operation based at least in part on applying the respective one of the plurality of voltages to each respective disjoint subset, and apply the selected voltage to the plurality of memory arrays to execute the read operation.

In some examples, the apparatus may be configured to apply two or more of the plurality of voltages to the respective disjoint subsets concurrently.

In some examples, the apparatus may be configured to identify, for each of the disjoint subsets and based at least in part on applying the plurality of voltages, a quantity of memory cells within each disjoint subset having a threshold voltage that may be less than the respective one of the plurality of voltages applied to each disjoint subset, where selecting the voltage may be based at least in part on identifying the quantity of memory cells within each disjoint subset.

In some examples, the apparatus may be configured to apply, during a first time interval that at least partially overlaps with a second time interval associated with identifying the quantity of memory cells, a second voltage to the plurality of memory arrays, where applying the selected voltage may be based at least in part on applying the second voltage.

In some examples, the apparatus may be configured to select the voltage based at least in part on an association (e.g., a linear association) between the identified quantity of memory cells within each disjoint subset and the respective one of the plurality of voltages applied to each disjoint subset.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method at a memory device, comprising:
    receiving a read command to perform a read operation on a plurality of memory arrays, the plurality of memory arrays comprising disjoint subsets;
    applying a respective one of a plurality of voltages to each respective disjoint subset of the disjoint subsets based at least in part on receiving the read command to perform the read operation;
    selecting a voltage to apply to the plurality of memory arrays during an execution of the read operation based at least in part on applying the respective one of the plurality of voltages to each respective disjoint subset; and applying the selected voltage to the plurality of memory arrays to execute the read operation.

2. The method of claim 1, wherein applying the respective one of the plurality of voltages to each respective disjoint subset comprises:
applying two or more of the plurality of voltages to the respective disjoint subsets concurrently.

3. The method of claim 1, further comprising:
identifying, for each of the disjoint subsets and based at least in part on applying the plurality of voltages, a quantity of memory cells within each disjoint subset having a threshold voltage that is less than the respective one of the plurality of voltages applied to each disjoint subset, wherein selecting the voltage is based at least in part on identifying the quantity of memory cells within each disjoint subset.

4. The method of claim 3, further comprising:
applying, during a first time interval that at least partially overlaps with a second time interval associated with identifying the quantity of memory cells, a second voltage to the plurality of memory arrays, wherein applying the selected voltage is based at least in part on applying the second voltage.

5. The method of claim 4, wherein a first magnitude of the second voltage is less than or equal to a second magnitude of the selected voltage.

6. The method of claim 3, wherein selecting the voltage comprises:
selecting the voltage based at least in part on an association between the identified quantity of memory cells within each disjoint subset and the respective one of the plurality of voltages applied to each disjoint subset.

7. The method of claim 1, further comprising:
determining that a quantity of memory cells within a first disjoint subset having a threshold voltage that is less than a first voltage of the plurality of voltages applied to the first disjoint subset satisfies a criterion, wherein selecting the voltage from the plurality of voltages comprises selecting the first voltage from the plurality of voltages.

8. The method of claim 7, wherein the criterion comprises a ratio of first memory cells within each disjoint subset having a threshold voltage that is less than the respective one of the plurality of voltages applied to each disjoint subset and second memory cells within each disjoint subset having a threshold voltage that is greater than the respective one of the plurality of voltages applied to each disjoint subset.

9. The method of claim 1, wherein:
selecting the voltage to apply to the plurality of memory arrays during the execution of the read operation comprises:
selecting a magnitude of the voltage to apply to the plurality of memory arrays; and
applying the selected voltage to the plurality of memory arrays comprises:
applying a first voltage pulse having the magnitude and a first polarity; and
applying a second voltage pulse having the magnitude and a second polarity different than the first polarity.

10. The method of claim 1, wherein:
the plurality of memory arrays corresponds to a partition of the memory device; and
each memory array corresponds to a respective tile of the memory device.

11. An apparatus, comprising:
a plurality of memory arrays each comprising disjoint subsets of memory cells;
an interface coupled with the plurality of memory arrays and a host device, the interface configured to receive a read command to perform a read operation on the plurality of memory arrays; and
circuitry coupled with each of the plurality of memory arrays and configured to:
apply a respective one of a plurality of voltages to each respective disjoint subset of the disjoint subsets based at least in part on receiving the read command to perform the read operation;
select a voltage to apply to the plurality of memory arrays during an execution of the read operation based at least in part on applying the respective one of the plurality of voltages to each respective disjoint subset; and
apply a selected voltage to the plurality of memory arrays to execute the read operation.

12. The apparatus of claim 11, wherein applying the respective one of the plurality of voltages to each respective disjoint subset comprises:
applying two or more of the plurality of voltages to the respective disjoint subsets concurrently.

13. The apparatus of claim 11, further comprising:
a plurality of detection circuits each coupled with a respective disjoint subset of the disjoint subsets, wherein each detection circuit is configured to identify, based at least in part on the circuitry applying the respective one of the plurality of voltages, a quantity of memory cells within the respective disjoint subset having a threshold voltage that is less than the respective one of the plurality of voltages applied to the respective disjoint subset, wherein selecting the voltage is based at least in part on identifying the quantity of memory cells with the respective disjoint subset.

14. The apparatus of claim 13, wherein the circuitry is further configured to:
apply, during a first time interval that at least partially overlaps with a second time interval associated with identifying the quantity of memory cells, a second voltage to the plurality of memory arrays, wherein applying the selected voltage is based at least in part on applying the second voltage.

15. The apparatus of claim 14, wherein a first magnitude of the second voltage is less than or equal to a second magnitude of the selected voltage.

16. The apparatus of claim 13, wherein selecting the voltage comprises:
selecting the voltage based at least in part on an association between the identified quantity of memory cells within each disjoint subset and the respective one of the plurality of voltages applied to each disjoint subset.

17. The apparatus of claim 11, further comprising:
a detection circuit coupled with a first disjoint subset and configured to determine that a quantity of memory cells within the first disjoint subset having a threshold voltage that is less than a first voltage of the plurality of voltages applied to the first disjoint subset satisfies a criterion, wherein selecting the voltage from the plurality of voltages comprises selecting the first voltage from the plurality of voltages.

18. The apparatus of claim 17, wherein the criterion comprises a ratio of first memory cells within each disjoint subset having a threshold voltage that is less than the respective one of the plurality of voltages applied to each disjoint subset and second memory cells within each disjoint subset having a threshold voltage that is greater than the respective one of the plurality of voltages applied to each disjoint subset.

19. The apparatus of claim 11, wherein:
selecting the voltage to apply to the plurality of memory arrays during the execution of the read operation comprises:
selecting a magnitude of the voltage to apply to the plurality of memory arrays; and
applying the selected voltage to the plurality of memory arrays comprises:
applying a first voltage pulse having the magnitude and a first polarity; and
applying a second voltage pulse having the magnitude and a second polarity different than the first polarity.

20. The apparatus of claim 11, wherein:
the plurality of memory arrays corresponds to a partition of the apparatus; and
each memory array corresponds to a respective tile of the apparatus.

21. An apparatus, comprising:
a controller configured to cause the apparatus to:
receive a read command to perform a read operation on a plurality of memory arrays, the plurality of memory arrays comprising disjoint subsets;
apply a respective one of a plurality of voltages to each respective disjoint subset of the disjoint subsets based at least in part on receiving the read command to perform the read operation;
select a voltage to apply to the plurality of memory arrays during an execution of the read operation based at least in part on applying the respective one of the plurality of voltages to each respective disjoint subset; and
apply the selected voltage to the plurality of memory arrays to execute the read operation.

22. The apparatus of claim 21, wherein applying the respective one of the plurality of voltages to each respective disjoint subset comprises:
applying two or more of the plurality of voltages to the respective disjoint subsets concurrently.

23. The apparatus of claim 21, wherein the controller is further configured to cause the apparatus to:
identifying, for each of the disjoint subsets and based at least in part on applying the plurality of voltages, a quantity of memory cells within each disjoint subset having a threshold voltage that is less than the respective one of the plurality of voltages applied to each disjoint subset, wherein selecting the voltage is based at least in part on identifying the quantity of memory cells within each disjoint subset.

24. The apparatus of claim 23, wherein the controller is further configured to cause the apparatus to:
applying, during a first time interval that at least partially overlaps with a second time interval associated with identifying the quantity of memory cells, a second voltage to the plurality of memory arrays, wherein applying the selected voltage is based at least in part on applying the second voltage.

25. The apparatus of claim 23, wherein selecting the voltage comprises:
selecting the voltage based at least in part on an association between the identified quantity of memory cells within each disjoint subset and the respective one of the plurality of voltages applied to each disjoint subset.

* * * * *